United States Patent
Koroglu

(10) Patent No.: US 10,110,177 B1
(45) Date of Patent: Oct. 23, 2018

(54) PROGRAMMABLE IMPEDANCE CONTROL FOR A TRANSFORMER

(71) Applicant: Silicon Laboratories Inc., Austin, TX (US)

(72) Inventor: Mustafa Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/662,375

(22) Filed: Jul. 28, 2017

(51) Int. Cl.
| | |
|---|---|
| H04B 1/04 | (2006.01) |
| H03F 3/195 | (2006.01) |
| H03F 1/56 | (2006.01) |
| H03F 3/193 | (2006.01) |
| H03F 3/21 | (2006.01) |
| H01F 27/28 | (2006.01) |
| H04B 1/40 | (2015.01) |

(52) U.S. Cl.
CPC ............ *H03F 1/565* (2013.01); *H01F 27/28* (2013.01); *H03F 3/193* (2013.01); *H03F 3/21* (2013.01); *H04B 1/40* (2013.01); *H03F 2200/387* (2013.01); *H03F 2200/451* (2013.01)

(58) Field of Classification Search
CPC . H04B 1/0458; H04B 2001/045; H03F 1/347; H03F 1/565; H03F 3/21; H03F 3/189; H03F 3/195; H03F 2200/351; H03F 2200/541

USPC .. 455/73, 127.1, 127.2, 127.3, 127.4, 127.5; 330/51, 124 R, 151, 152, 276, 277, 278

See application file for complete search history.

(56) References Cited

U.S. PATENT DOCUMENTS

| | | | | |
|---|---|---|---|---|
| 7,728,661 | B2 * | 6/2010 | Bockelman | H03F 1/0277 330/124 R |
| 7,990,220 | B2 * | 8/2011 | Kondo | H03F 1/0272 330/276 |
| 8,536,948 | B2 * | 9/2013 | Kawai | H01P 5/10 330/124 R |
| 8,786,381 | B2 * | 7/2014 | Kimball | H01F 27/2804 333/238 |
| 9,112,459 | B2 * | 8/2015 | Ho | H03F 3/45 |
| 9,160,377 | B2 * | 10/2015 | Lee | H03F 1/0277 |
| 9,209,769 | B2 * | 12/2015 | Kawano | H03F 1/0277 |
| 2009/0273397 | A1 | 11/2009 | Bockelman et al. | |
| 2010/0164621 | A1 | 7/2010 | Srinivasan et al. | |
| 2010/0328546 | A1 | 12/2010 | Rafi et al. | |
| 2012/0249270 | A1 | 10/2012 | Li et al. | |
| 2013/0171954 | A1 | 7/2013 | Koroglu et al. | |
| 2017/0110792 | A1 | 4/2017 | Le Goff et al. | |

\* cited by examiner

*Primary Examiner* — Quochien B Vuong
(74) *Attorney, Agent, or Firm* — Egan Peterman Enders Huston

(57) ABSTRACT

In one aspect, an apparatus includes: a first power amplifier to receive a first voltage signal and to output a first current; a second power amplifier to receive a second voltage signal and to output a second current; and a transformer coupled to the first power amplifier and the second power amplifier. The transformer may have multiple differential input ports to realize a controllable impedance based on a desired output power level.

20 Claims, 8 Drawing Sheets

PROGRAMMABLE IMPEDANCE CONTROL FOR A TRANSFORMER

BACKGROUND

In a radio transmitter, optimization of a power amplifier (PA) generally requires different load impedances to maximize efficiency and hence improve battery life. If a PA is to operate at different power levels, a lower load impedance is used for a high power (HP) mode, while a higher impedance is required to optimize PA efficiency for a low power (LP) mode. If a transmitter does not have means to adjust the impedance level, typical design considerations dictate that the PA be optimized only for a maximum supported power level. Instead, lower power level transmission is achieved by backing off PA power by way of gain control. Backing off PA power, however, reduces the PA efficiency, degrading battery life.

Many transmitters include an on-chip LC network to provide different impedance levels at the PA output. However, use of on-chip LC networks results in larger die area, increasing cost and size. Moreover, on-chip LC networks are generally quite lossy, which induce higher loss throughout a transmitter signal chain, causing reduced PA efficiency. As such, current transmitters suffer from inefficiencies.

SUMMARY OF THE INVENTION

In one aspect, an apparatus includes: a first power amplifier to receive a first voltage signal and to output a first current; a second power amplifier to receive a second voltage signal and to output a second current; and a transformer coupled to the first power amplifier and the second power amplifier. In an example, the transformer comprises a primary side formed on at least one first metal layer of a semiconductor die and having a plurality of input ports including a first pair of input ports and a second pair of input ports. The primary side may comprise: a first coil segment coupled between a first input port of the first pair of input ports and a first input port of the second pair of input ports; a second coil segment coupled between a second input port of the first pair of input ports and a second input port of the second pair of input ports; and a third coil segment coupled between the first input port of the second pair of input ports and the second input port of the second pair of input ports. The transformer may further include a secondary side formed on a second metal layer of the semiconductor die to form a vertical transformer, where the secondary side has a first output port to couple to an output load to provide an output signal and a second output port to couple to a reference voltage node.

In an example, the primary side further comprises a fourth coil segment coupled between a center tap and the second input port of the second pair of input ports, and the third coil segment is coupled between the center tap and the first input port of the second pair of input ports. The apparatus may further include a comparator to provide a first supply voltage to the center tap, where the first supply voltage is controllable based on an output power level. The comparator may provide the first supply voltage to the center tap when the first power amplifier is enabled and the second power amplifier is disabled. The apparatus may further include a control circuit to provide a second supply voltage to the center tap when the second power amplifier is enabled and the first power amplifier is disabled, where the second supply voltage is different than the first supply voltage.

In an example, the primary side comprises a differential primary side and the secondary side comprises a single-ended secondary side. The primary side may be formed of a plurality of conductors including a first set of conductors having a first width and a second set of conductors having a second width. The first coil segment and the second coil segment may comprise the first set of conductors having the first width, where the first width is smaller than the second width.

In an example, the first power amplifier and the second power amplifier have different output transconductances and may directly couple to the transformer without a matching network. The apparatus may further include a controller to identify an output power level and to dynamically enable the first power amplifier and disable the second power amplifier in response to the identification of the power level. When the second power amplifier is disabled, the first current output by the first power amplifier may be adapted to flow through the third coil segment and not the first coil segment or the second coil segment, to induce the output signal in the secondary side of the transformer. In an example, the first power amplifier is coupled to the first input port of the second pair of input ports and the second input port of the second pair of input ports, and the second power amplifier is coupled to the first input port of the first pair of input ports and the second input port of the first pair of input ports.

In another aspect, an integrated circuit includes: a power amplifier to receive a first voltage signal and to output a first current; and a transformer coupled to the power amplifier. In an example, the transformer comprises a primary side formed on at least one first metal layer of a semiconductor die and having a pair of input ports and a secondary side formed on a second metal layer of the semiconductor die to form a vertical transformer. The secondary side may have a first output port to couple to an output load and a second output port to couple to a reference voltage node. In an example, the primary side comprises: a first coil segment coupled between a first input port of the pair of input ports and a first node; a second coil segment coupled between a second input port of the pair of input ports and a second node; and a third coil segment coupled between the first node and the second node; and. The integrated circuit may further include a switch to switchably couple and decouple the third coil segment with respect to the transformer.

In an example, the primary side further comprises a fourth coil segment coupled between a center tap and the second node, where the third coil segment is coupled between the center tap and the first node. The primary side may be formed of a plurality of conductors including a first set of conductors having a first width and a second set of conductors having a second width, and where the first coil segment and the second coil segment comprise the first set of conductors and the third coil segment and the fourth coil segment comprise the second set of conductors, the first width greater than the second width. In turn, the switch, when enabled, is to short the first node and the second node and to decouple the third coil segment.

In another aspect, an apparatus includes a transceiver to communicate signals according to one or more wireless communication protocols and an antenna coupled to the transceiver to send the signals wirelessly. In an example, the transceiver comprises: a first power amplifier to receive a first voltage signal and output a first current; a second power amplifier to receive a second voltage signal and output a second current; and a multi-port transformer coupled to the first power amplifier and the second power amplifier. In an example, the multi-port transformer comprises: a primary side formed on at least one first metal layer of a semiconductor die and having a first pair of input ports and a second pair of input ports and a secondary side formed on a second metal layer of the semiconductor die to form a vertical transformer, where the secondary side is to couple to the antenna. In an example, the first power amplifier is coupled to a first input port of the first pair of input ports and a second input port of the first pair of input ports. In turn, the second power amplifier is coupled to a first input port of the second pair of input ports and a second input port of the second pair of input ports. A first set of conductors may be adapted to couple between the first input port of the second pair of input ports and the second input port of the second pair of input ports and a second set of conductors may be adapted to couple between the first input port of the first pair of input ports and the second input port of the first pair of input ports. In an example, the first set of conductors and the second set of conductors have different widths.

In an example, the apparatus further includes a comparator to provide a first supply voltage to a center tap of the primary side when the first power amplifier is enabled and the second power amplifier is disabled. The first supply voltage may be controllable based on an output power level, where the center tap is coupled between the first input port of the second pair of input ports and the second input port of the second pair of input ports. The apparatus may further include a control circuit to provide a second supply voltage to the center tap when the second power amplifier is enabled and the first power amplifier is disabled, where the second supply voltage is different than the first supply voltage.

DETAILED DESCRIPTION

In various embodiments, a transmitter, e.g., as implemented within a single semiconductor die of an integrated circuit (IC), may include a single transformer for use with one or more power amplifiers (PAs) of the transmitter. More specifically, this single transformer has a multi-ported input coupled to receive an output of the PA. In many implementations, this PA may be a differential PA, and the transformer may be implemented having a primary side including multiple differential input ports. Depending on transformer implementation, impedance controllability/programmability can be achieved through: 1) electrically shorting at least a portion of a primary side of the transformer (by shorting selected turns of an inductor that forms the primary side) to reduce the impedance seen by a PA core; and/or 2) providing multiple PA cores, with each PA core optimized for a given power figure. Then these optimized PA cores can be coupled to different ports of the primary side. As one such example, a low power (LP) PA core may be coupled to drive ports that couple to all the primary turns. In turn, a high power (HP) PA core may be coupled to drive ports that couple to selected (e.g., inner) turns having a lower load converted load impedance.

By using an embodiment, an appropriate level of impedance is realized for different power levels. In other words, the transformer can convert an external load impedance to a higher impedance for lower power levels and to a lower impedance for higher power levels by shorting out inner turns. Or the transformer may include multiple differential primary input ports, including a first differential input port exhibiting lower impedance and a second differential input port exhibiting higher impedance. Use of a single transformer reduces die area, resulting in a more cost-efficient solution.

While embodiments are not limited in this regard, controllable impedance techniques using a transformer as described herein may be used in a variety of radio frequency (RF) integrated circuits where different impedance conversion ratios can be realized to optimize receiver/transmitter performance for different standards and applications. By using a single on-chip transformer as described herein, reduced area and power consumption in an IC can be realized.

Figure 1:
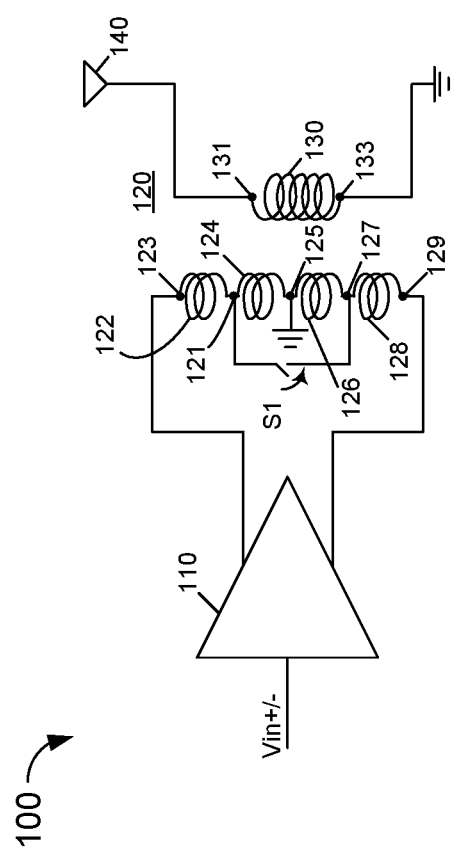
FIG. 1 is a schematic diagram of a portion of a transmitter in accordance with an embodiment.

Referring now to FIG. 1, shown is a schematic diagram of a portion of a transmitter in accordance with an embodiment. More specifically, transmitter 100 in FIG. 1 may be implemented at least partially within an integrated circuit (IC), which may be a given type of transmitter device, transmitter/receiver device (transceiver) or so forth. As an example, transmitter 100 may be a transmitter portion of a wireless transceiver, such as a short-range wireless transceiver that may implement one or more wireless communication protocols, such as a Wi-Fi™ communication protocol, a Bluetooth™ communication protocol, a Zigbee™ communication protocol or so forth.

In any event, as illustrated in FIG. 1 transmitter 100 includes a power amplifier 110. In various embodiments, power amplifier (PA) 110 may be implemented as a transconductance-based amplifier to receive a differential incoming voltage signal (Vin+/−) representing a signal to be transmitted and convert this voltage into a current. In turn, PA 110 outputs this current to drive a load including a transformer 120 that in turn is coupled to an output device, namely an antenna 140. In embodiments herein, note that all components in FIG. 1 other than antenna 140 may be implemented within a given IC. In the embodiment of FIG. 1, PA 110 is a differential amplifier. As such, PA 110 may receive an incoming differential signal (Vin+/−) and provide a differential current output to transformer 120.

As illustrated, transformer 120 includes a primary side and a secondary side. More specifically, a primary side of transformer 120 may be formed of a plurality of coil segments 122, 124, 126 and 128. In an embodiment, these coil segments may be implemented as conductive traces or turns formed on one or more metal layers of a semiconductor die, and in a particular embodiment may be implemented as one or more inductors. As will be described herein, the arrangement more specifically provides for outer coils 122 and 128, which may always be coupled to PA 110 via output of PA 110 being coupled to ports 123 and 129 both in low power and high power modes. Instead, inner coils 124 and 126 are switchable inner turns that may be controllably switched to be coupled to PA 110 in a low power mode, but switchably de-coupled, by way of switch S1 in a high power mode.

With further reference to FIG. 1, the secondary side of transformer 120 is formed of a single coil 130 having a first port coupled to a first node 131 in turn coupled to antenna 140 and a second port 133 coupled in turn to a second node that couples to the reference voltage potential. Transformer 120 may be implemented using a vertical configuration in which turns of the primary coil may be formed on one more metal layers of a semiconductor die. And turns of the secondary coil may be formed on another metal layer, with the turns of this secondary coil vertically arranged with respect to the turns of the primary coil. As the primary and secondary sides are aligned vertically with very little spacing in between them, a high magnetic coupling ratio is realized.

As illustrated in FIG. 1, switch S1 when enabled or closed creates a short circuit between nodes 121 and 127, which in turn causes inner coils 124 and 126 to be de-coupled from PA 110. Note that FIG. 1 shows a conceptual drawing for a PA having a transformer with switchable turns in which high frequency currents bypass inner turns in a high power mode.

In the embodiment of FIG. 1, when switch S1 is off, all the turns (outer turns 122, 128 and inner turns 124, 126) contribute to the primary self-inductance. Hence an impedance at the secondary side is transformed with an impedance conversion ratio of (Lpri/Lsec). As all the turns conduct current contributing to the magnetic flux, Lpri is maximized, and thus a higher impedance conversion ratio is realized. When switch S1 is enabled (on), inner turns (124, 126) are shorted out, preventing them from contributing to the magnetic flux. As such, the Lpri is lowered. In this case, a lower impedance conversion ratio is realized.

As the non-zero resistance of inductor traces induces more power loss when the converted impedance is lower, outer turns 122, 128, which realize a lower impedance conversion ratio when inner turns 124, 126 are shorted out, have wider metal traces to reduce their resistance. Inner turns 124, 126, on the other hand, are designed to have narrower traces to pack in more turns and keep inductor area small so the converted impedance is higher and hence higher trace resistance can be tolerated. Understand while shown at this high level in the implementation of FIG. 1, many variations and alternatives are possible, and note that this high level is for ease of illustration of the controllable transformer.

Figure 2:
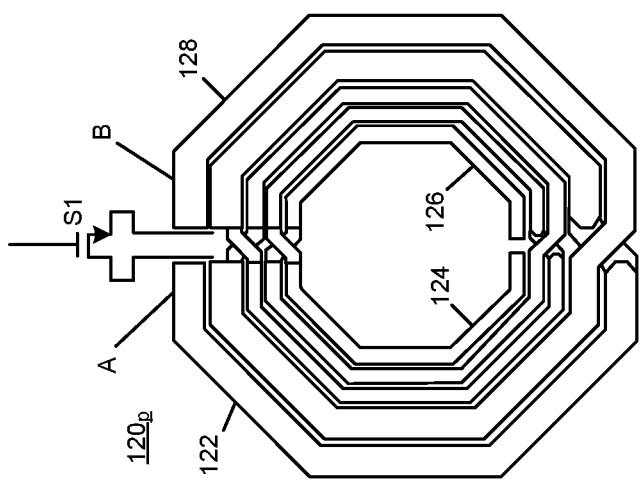
FIG. 2 is an illustration of a primary side of a transformer in accordance with an embodiment.

Referring now to FIG. 2, shown is an illustration of a primary side of a transformer in accordance with an embodiment. As shown in FIG. 2, this primary side $120_p$ (which represents the primary side of transformer 120 of the schematic diagram in FIG. 1) includes a first outer coil 122 and a second outer coil 128. Outer coils 122, 128 each have an input port (A and B, respectively) that in turn is to couple to an input line from which an input current is received. Stated another way, these outer coils 122, 128 have ports (A and B) that couple to the differential outputs of PA 110. In addition, the primary side of the transformer includes inner coils 124 and 126 that couple to outer coils 122, 128 when switch S1 is disabled (when switch S1 is OFF). In the embodiment shown in FIG. 2, switch S1 may be implemented as a metal oxide semiconductor field effect transistor (MOSFET), e.g., the N-channel MOSFET (NMOS) shown. Note that in the embodiment of FIG. 2, outer coils 122, 128 may be formed having wider widths than narrower, inner coils 124, 126. Note that the widths of the traces may be dependent on what impedance and power levels are used and the conductivity of metals offered in a particular wafer fabrication technology. Note that with a narrower width, inner coils 124, 126 present a greater impedance than the impedance presented by outer coils 122, 128. In the example shown in FIG. 2, there are N=2 outer turns and three inner turns that form the primary side. Of course other numbers of turns for both the inner and outer coils may be realized in other embodiments.

Further, although embodiments are not limited in this regard, in one particular embodiment, the coils that form the primary side of transformer 120 may be implemented as conductive traces on one or more layers of a semiconductor die. For example, coils 122-128 that form the primary side may be formed on one or more metal layers of a semiconductor die. To enable magnetic coupling via this primary of a transformer, connectors may be provided (shown in a general form in FIG. 2) that are implemented on one or more other semiconductor layers to enable the conductive traces as formed on a given semiconductor die layer to be communicated to further conductive traces that form coils of the primary side of the transformer. And note that these coils 122-128 that are formed on different metal layers of a semiconductor die can be located on different layers in different implementations (such as based on process rules for a given semiconductor manufacturing process). For example, in one particular embodiment the thicker turns of outer coils 122, 128 may be formed on an ultra thick metal (namely UTM). In turn, the turns implemented via inner coils 124, 126 may be formed on the same metal layer. And in some embodiments, additional interim metal layers may be used to provide interconnection between the coil portions implemented on different metal layers. For example, strapped metal layers may be used to provide underpasses or interconnection between the various turns. For example, such strap metal layers may include portions of conductive traces on thinner metal layers M3, M4 and metal layers M5, M6. In yet other embodiments, the various coils of the primary side themselves may be formed on different metal layers.

In a particular embodiment, the coils of a primary side of a transformer may be implemented on middle metal layers of a semiconductor die. Such metal layers may be implemented as copper-based metal layers and may have a thickness of between approximately 1-3 microns in an embodiment. Note that these middle metal layers may be formed above lower metal layers of a semiconductor die. Such lower metal layers may be relatively thinner metal layers and may be implemented as copper (which may be on the order of between approximately 0.1-0.5 microns thick). And further in turn, note that the secondary side of a transformer as implemented herein may be formed on, e.g., a top metal layer which may be implemented as an aluminum-based metal layer, such as a redistribution layer (RDL).

Figure 3:
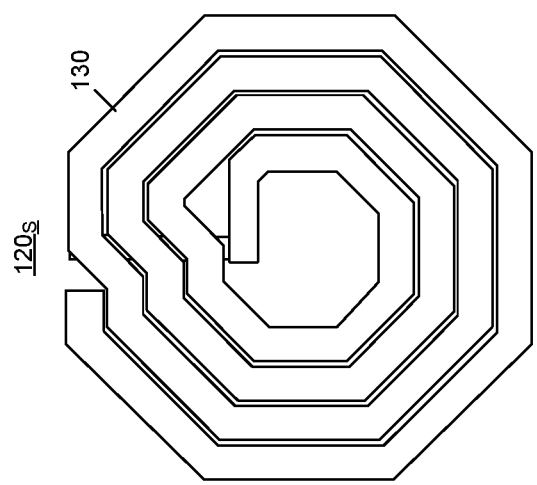
FIG. 3 is an illustration of a secondary side of a transformer in accordance with an embodiment.

Referring now to FIG. 3, shown is an illustration of a secondary side of a transformer in accordance with an embodiment. As shown in FIG. 3, the secondary side may be formed of a spiral coil 130 that is implemented as a single spiral conductor. As with the discussion above regarding the primary side, this conductor that forms 130 may be adapted on a single metal layer of a semiconductor device (with connectors that traverse via traces to one or more additional layers of the semiconductor die). Note that in contrast to the differential primary side of the transformer, secondary coil 130 is implemented as a single-ended spiral inductor to provide a single-ended output signal to a load (e.g., an attached antenna).

With an implementation of a transmitter as in FIG. 1, a single PA is provided with a controllable impedance. Although a single PA is provided, given different implementations of a transmitter including a design as in FIG. 1 and/or where a transmitter is to transmit at a variety of different power levels, e.g., dynamically based on system operation (such as an indication from a separate receiver of wireless signals that indicates a desired power level), typically the PA is designed to maximize efficiency at high power levels. As such, when transmitter operation is at a lower power level than this maximum power level, efficiency may be impaired. Accordingly, embodiments having a controllable impedance may further provide for multiple PAs, each optimized for power efficiency at different power levels. In this way, depending upon a particular mode of operation (e.g., a low power mode or high power mode) a given one of these PAs may be dynamically controlled to be enabled for operation, such that efficiency improves. In other cases, while a transmitter may include multiple PAs, by static control a given transmitter is statically controlled to operate using only one PA (e.g., as implemented within firmware).

Figure 4:
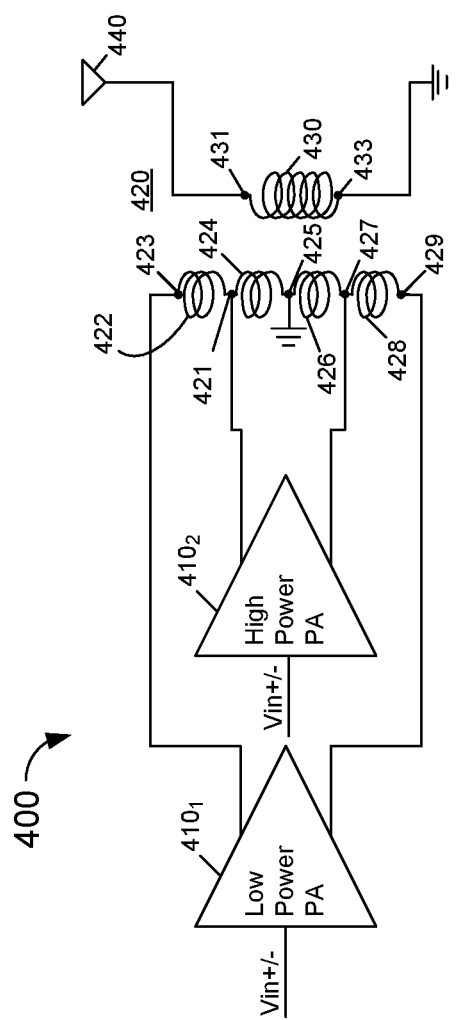
FIG. 4 is a schematic diagram of a portion of a transmitter in accordance with another embodiment.

Referring now to FIG. 4, shown is a schematic diagram of a portion of a transmitter in accordance with another embodiment. More specifically, transmitter 400 in FIG. 4 may be implemented at least partially within an IC such as a given transmitter device. In the embodiment of FIG. 4, a plurality of power amplifiers $410_1$ and $410_2$ are provided. Note that while two power amplifiers are shown for ease of illustration in FIG. 4, in a given embodiment, a transmitter may include more than two PAs, to accommodate a variety of different power levels with high efficiency. Commonly enumerated components as in FIG. 1 (of the 400 series instead of the 100 series of FIG. 1) depict similar components, and are not described further here. As illustrated in FIG. 4 the primary side of transformer 420 includes a plurality of differential input ports. More specifically, low power PA $410_1$ couples to input ports 423 and 429. In turn, high power PA $410_2$ couples to input ports 421 and 427. By providing multiple input ports to the primary side of transformer 420, a controllable impedance is realized. While two pairs of differential input ports (and 2 sets of coil segments) are shown in FIG. 4, in other embodiments greater than two sets of ports/coil segments can be provided. Note further that with the implementation of PAs 410 as transconductor-based PAs that act as current sources, no physical switches are used. Instead, when a given PA 410 is not active, a high impedance state or tri-state exists, such that no current is provided to the coupled input ports of the primary side of transformer 420.

Transformer 420 of FIG. 4 is thus a multi-port transformer having two differential ports in the primary section. In this arrangement, the inner differential port has a lower impedance conversion ratio than the outer differential port. While this structure does not short out inductor traces, it has dedicated ports for higher and lower impedance paths. For similar reasons discussed above, the traces of the primary turns that generate higher impedance in the primary side are designed to be narrower to keep inductor area smaller. That is, in this embodiment the outer turns have a narrower width than the inner turns. In other aspects, transmitter 400 may be configured similarly to transformer 100 of FIG. 1. Further understand while shown at this high level in the embodiment of FIG. 4, many variations and alternatives are possible.

Figure 5:
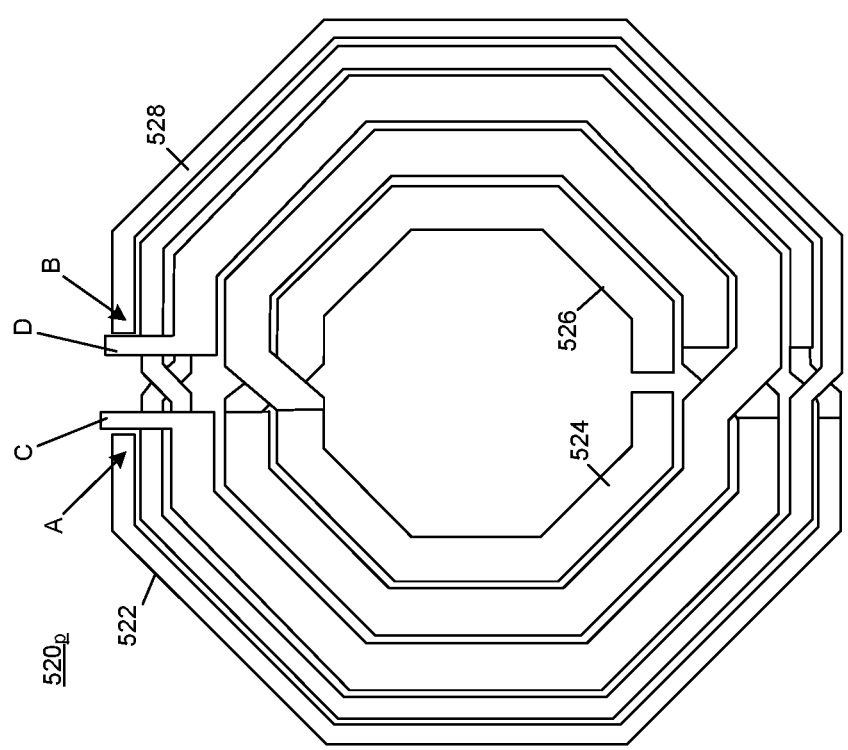
FIG. 5 is an illustration of a primary side of a transformer in accordance with another embodiment.

Referring now to FIG. 5, shown is an illustration of a primary side of a transformer in accordance with another embodiment. As shown in FIG. 5, this primary side includes a first outer coil 522 and a second outer coil 528. In the embodiment of FIG. 5 (in contrast to the transformer embodiment shown in FIG. 2), note that inner coils 524 and 526 may be implemented with wider conductors. In turn, outer coils 522, 528 may be implemented with narrower conductors. Note also, in this embodiment there is no need for a switch to selectively couple/decouple given turns from the primary side, as instead the different input ports provide the ability to programmably control impedance. More specifically, outer coils 522, 528 have corresponding input ports A, B, and inner coils 524, 526 have corresponding input ports C, D.

Embodiments having a configurable/multi-port transformer as described herein allow use of a small single transformer that can optimize PA efficiency for both low power and high power operations. In this way, matching networks (such as narrowband matching networks) to achieve high and low impedance ports can be avoided. By not including a matching network, die area is reduced and PA efficiency increases, in that such additional matching network degrades efficiency.

Figure 6:
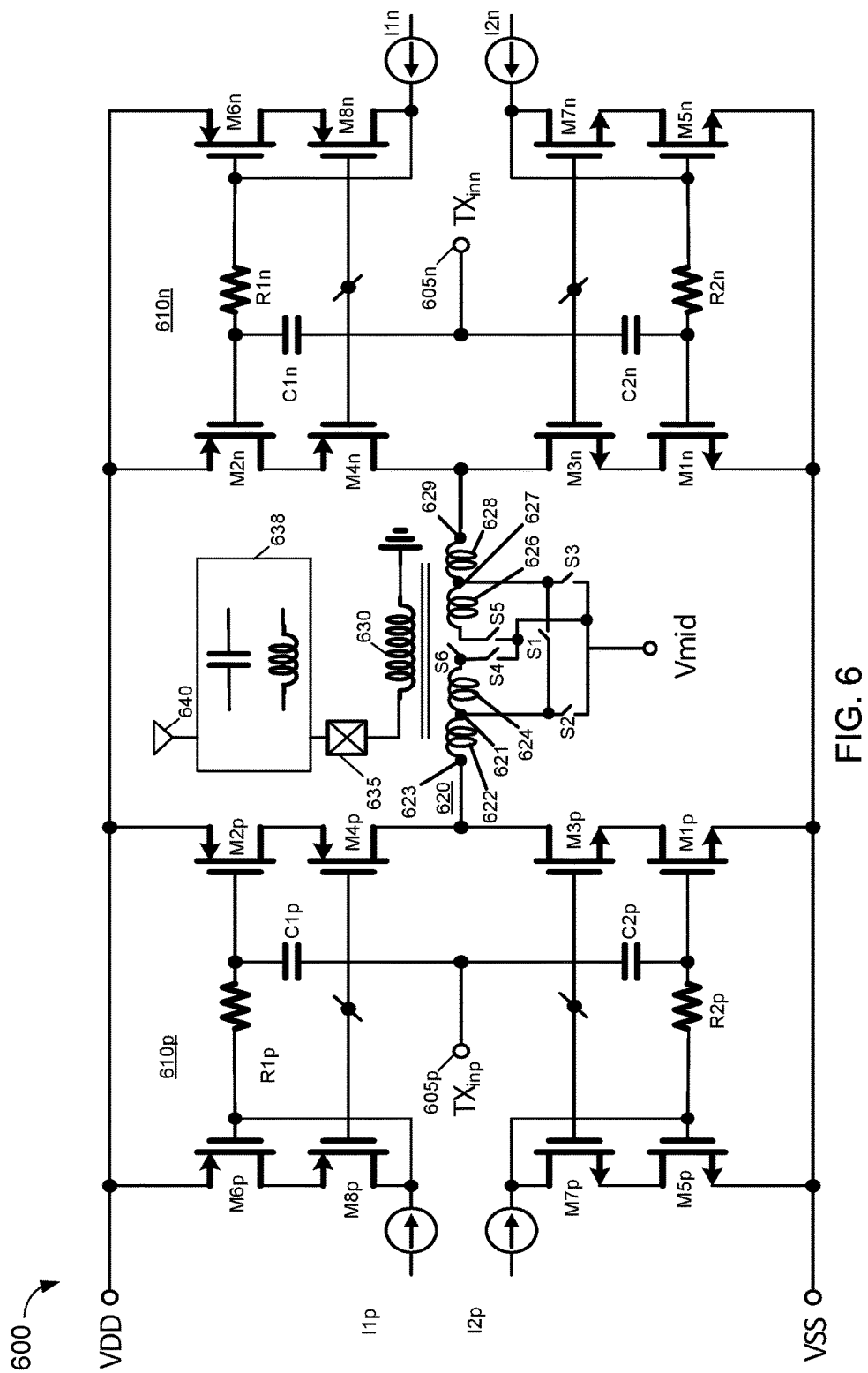
FIG. 6 is a schematic diagram of a more detailed arrangement of a transformer having a switchable configuration in accordance with an embodiment.

Referring now to FIG. 6, shown is a schematic diagram of a more detailed arrangement of a transformer having a switchable configuration as described herein. More specifically as shown in FIG. 6, a portion of a transmitter 600 is illustrated. In general, the portion of transmitter 600 includes a differential power amplifier having differential portions $610_n$, $610_p$ and a configurable transformer 620 as described herein. For ease of discussion, the components of the positive differential portion $610_p$ of the PA are discussed. Understand that similar components are present in the negative differential portion $610_n$ of the PA.

As illustrated, differential portion $610_p$ is coupled to receive an incoming signal $TX_{inp}$ via an input node $605_p$. In turn, this signal drives complementary transistors of the gain stage, namely a NMOS $M1_p$ and a PMOS device $M2_p$. As illustrated, the input signal couples through an RC network formed of resistors $R1_p$, $R2_p$ and capacitors $C1_p$, $C2_p$. NMOS device $M1_p$ has a drain terminal coupled to a cascode NMOS device $M3_p$ that in turn provides an output to transformer 620 via its drain terminal. Similarly PMOS device $M2_p$ has a drain terminal coupled to a cascode PMOS device $M4_p$ that in turn provides an output to transformer 620 via its drain terminal.

Note further that a current mirror configuration is provided, with NMOS devices $M5_p$, $M7_p$ acting as a current mirror for NMOS device $M1_p$. In turn PMOS devices $M6_p$, $M8_p$ act as a current mirror for PMOS device $M4_p$. As illustrated, a current source $I2_p$ couples to the commonly coupled drain terminal of NMOS device $M7_p$ and the gate terminal of NMOS device $M5_p$. Similarly, a current source $I1_p$ couples to the commonly coupled drain terminal of PMOS device $M8_p$ and the gate terminal of PMOS device $M6_p$.

With reference now to transformer 620, a primary side is formed with multiple coil segments 622, 624, 626 and 628, which are adapted similarly to transformer 120 in FIG. 1. A set of switches S1-S6 switchably enables inner turns 624, 626 to be dynamically controllable to be coupled to or decoupled from transformer 620. In low power mode: switches S1, S2 and S3 are open and S4, S5 and S6 are closed. In high power mode: switches S1, S2 and S3 are closed and S4, S5 and S6 are open. Switches S1 and S6 are switches that control shorting of inner turns (or not). As such, they operate as differential mode switches that are more efficient. Switches S2, S3, S4 and S5 are switches that provide a DC voltage to the primary center tap. Therefore S1 and S6 are bigger in size than S2, S3, S4 and S5. Switches S2-S5 are thus used to DC bias a center tap of the transformer primary. Note further that the secondary side of transformer 620 couples between a reference voltage node and a pin 635 that in turn couples to an off-chip load, such as an antenna 640 through an off-chip matching network 638 (formed of LC components).

Figure 7:
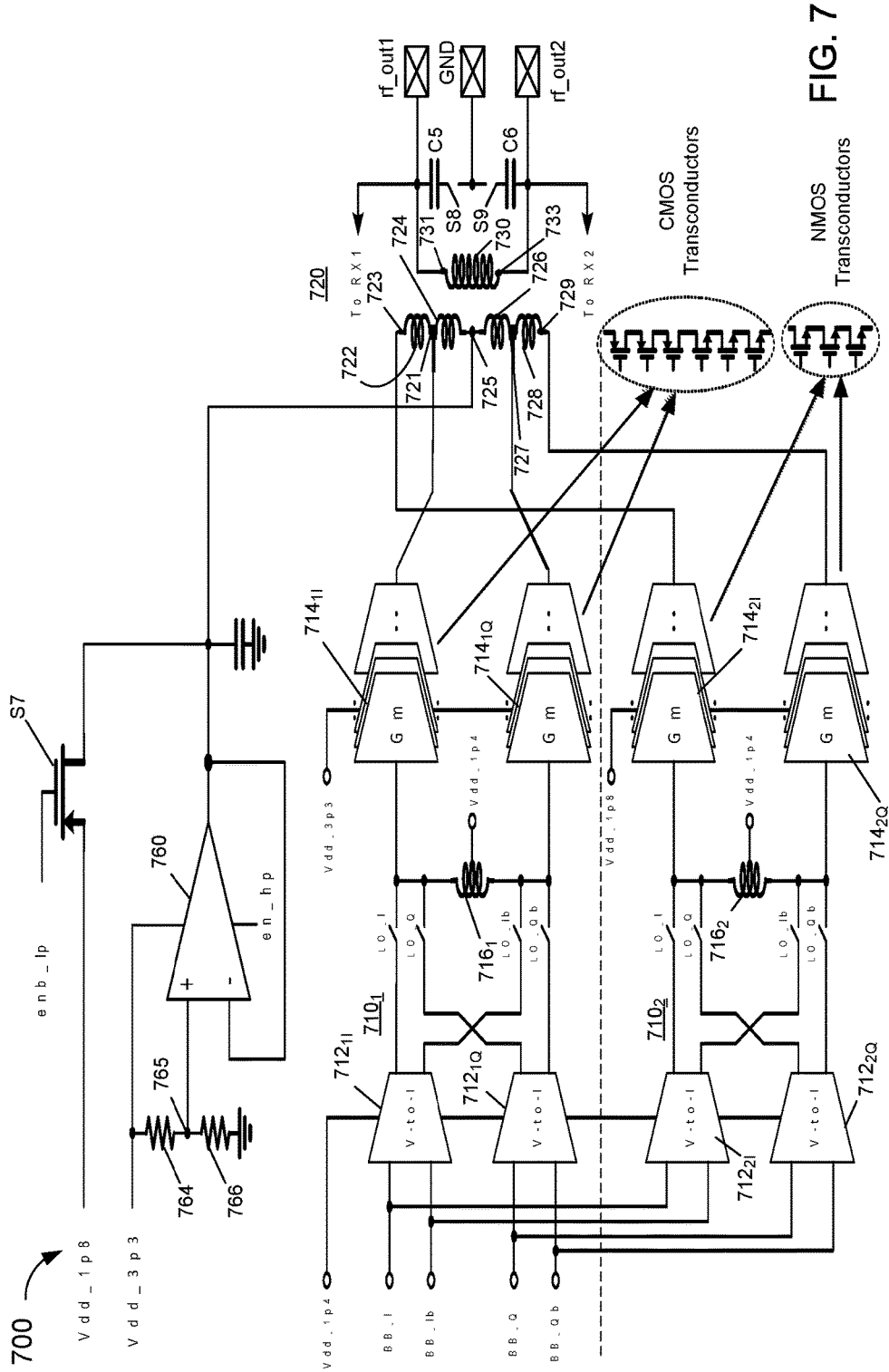
FIG. 7 is a schematic diagram of another implementation of a transmitter arrangement having multiple PAs in accordance with an embodiment.

Referring now to FIG. 7, shown is a schematic diagram of another implementation of a transmitter arrangement having multiple PAs in accordance with an embodiment. As shown in FIG. 7, the portion of transmitter 700 includes a high power PA $710_1$ and a low power PA $710_2$. In the embodiment illustrated, each of these PAs may be implemented differentially, and may be formed of multiple transconductance cells or slices that can be controllably enabled/disabled based on power requirements. With reference to high power PA $710_1$, an incoming differential baseband signal (BB_I, BB_$I_b$, and BB-Q, BB_$Q_b$) is provided through voltage-to-current converters $712_{1I}$, $712_{1Q}$ that upconvert the signals to a given output frequency (as LO_I/LO_Q and LO_Ib, LO_Qb). The differential outputs from these converters are switchably coupled to transconductance cells $714_{1I}$, $714_{1Q}$. In an embodiment, transconductance cells $714_{1I}$ and $714_{1Q}$ may be implemented using CMOS transconductors. The enabled transconductance cells $714_{1I}$ and $714_{1Q}$ provide an output that couples to inner input ports 721, 727 of a transformer 720, as described herein. Note that while a low supply voltage is provided to converters 712, GM cells $714_{1I}$ and $714_{1Q}$ operate from a higher voltage supply.

In an embodiment, the transconductance cells of high power PA $710_1$ may be implemented using a CMOS architecture, which may enable use of low voltage transistors. In an embodiment, an architecture for the high power transconductance cells may include a plurality of CMOS-based series-coupled transistors (as shown in the inset of FIG. 7 for CMOS GM cells $714_{1I}$ and $714_{1Q}$). More specifically, a set of three PMOS transistors and a set of three NMOS transistors may be provided. Each such transistor set may include a switch transistor in turn coupled to a bias transistor, in turn coupled to a cascode transistor that provides the output signal. In such an implementation, a cascode transistor (such as shown as NMOS device $M3_p$ in FIG. 6) provides for a boost in output impedance, as well as providing protection for the additional transistors of the transconductance cell when PA output swings at high amplitude levels. In embodiments, a cascode bias may be provided even when high power mode is disabled to protect the transistors against high swings. Also in this architecture, the input signal may be AC-coupled to a gate terminal of a bias transistor (such as NMOS $M1_p$ in FIG. 6). Such bias transistor may modulate its current around quiescent levels, resulting in a sink or source current at the output. Note that at DC level, both N-side and P-side currents are equal and thus there is no output DC current. In some embodiments, a transconductor cell may further include a switch transistor (which may couple to an input terminal of the bias transistor) to enable or disable the corresponding transconductance cell depending upon mode and power level.

In turn, low power PA $710_2$ may be similarly adapted with voltage-to-current converters $712_{2I}$, $712_{2Q}$ and transconductance cells $714_{2I}$, $714_{2Q}$. Note that the outputs of these transconductance cells couple to outer ports 723, 729 of transformer 720. In an embodiment, transconductance cells of low power PA $710_2$ may be implemented using NMOS transconductance cells (as shown in the inset of FIG. 7 for NMOS GM cells $714_{2I}$ and $714_{2Q}$). More specifically, an NMOS architecture having an open drain structure may be implemented. As with the above-described architecture for the high power transconductance cells, three NMOS devices may be provided in series (e.g., a switch transistor in turn coupled to a bias transistor, in turn coupled to a cascode transistor that provides the output signal). With an NMOS only structure, reduced input capacitance may be realized. The cascode transistor may boost the output impedance and provide protection for the other transistors when output swings at high amplitude levels, and may be provided with a cascode bias, even when the low power PA is disabled to protect the transistors against high swings. In turn, the input signal may be AC coupled to a gate terminal of the bias transistor to modulate its current around a quiescent level. The switch transistor in turn may enable or disable the transconductance cell depending upon mode and power levels.

Note that each PA 710 has an inductor $716_1$, $716_2$ that couples the quadrature up-converting mixers to the corresponding transconductance cells 714. In an embodiment, inductor 716 may operate as a pre-driver inductor to realize an LC resonator that can resonate out input capacitive loading of the PA transconductance cells. This inductor may also provide suppression for harmonic content at the mixer output at multiples of LO frequencies. Such inductor may be implemented as a magnetically and electrically differential inductor. In an embodiment, each inductor 716 may be implemented as a horizontal-based inductor (in contrast to the vertical output transformer) with inductor traces or coils formed on a single metal layer in horizontal relation to each other, with connecting underpasses or connectors strapped together via one or more lower level metal layers. In yet other embodiments, different inductor designs may inhere for the high power and low power paths. That is, in an embodiment, high power portion $710_1$ may not have a corresponding inductor $716_1$ implemented with a magnetically and electrically differential inductor as just discussed. Instead, inductor $716_2$ may be implemented as a magnetically (only) differential inductor having two single-ended spiral inductors, which may be implemented as a two-layer solenoid type inductor.

Still referring to FIG. 7, a controllable voltage may be applied to a center tap 725 of the primary side of transformer 720. More specifically, as seen a controllable voltage Vmid is provided to center tap 725 in order to bias outputs of the transconductance cells. In a high power mode, this voltage is generated by an operational amplifier (op-amp) 760 (such as a unity gain buffer), to provide a high power mode bias around one half of the supply voltage of the transconductance power supply for the CMOS transconductor outputs. As illustrated, op-amp 760 is configured to compare a reference voltage (present at an inter-resistor node 765 that couples between resistors 764 and 766) to its output voltage. Note further that op-amp 760 is coupled to receive a given supply voltage level and an enable signal. In turn, when op-amp 760 is to be disabled in a low power mode, switch S4 is closed to provide a different supply voltage level to center tap 725. More specifically in a low power mode, a low power supply voltage may couple to center tap 725 by way of switch S7 to bias the NMOS only, open-drain transconductor outputs.

In turn, transformer 720 outputs an amplified signal via secondary coil 730 that is output via output pads (RF_out1, RF_out2). Note that in some embodiments, these pads may be shared to also receive RF inputs and provide such RF inputs to a given differential receiver (not shown for ease of illustration in FIG. 7). To this end, coupling capacitors C5 and C6 may switchably couple via switches S8 and S9 to controllably switch these capacitors to couple to a ground level node. Understand while shown at this high level in the implementation of FIG. 7, many variations and alternatives are possible.

Figure 8:
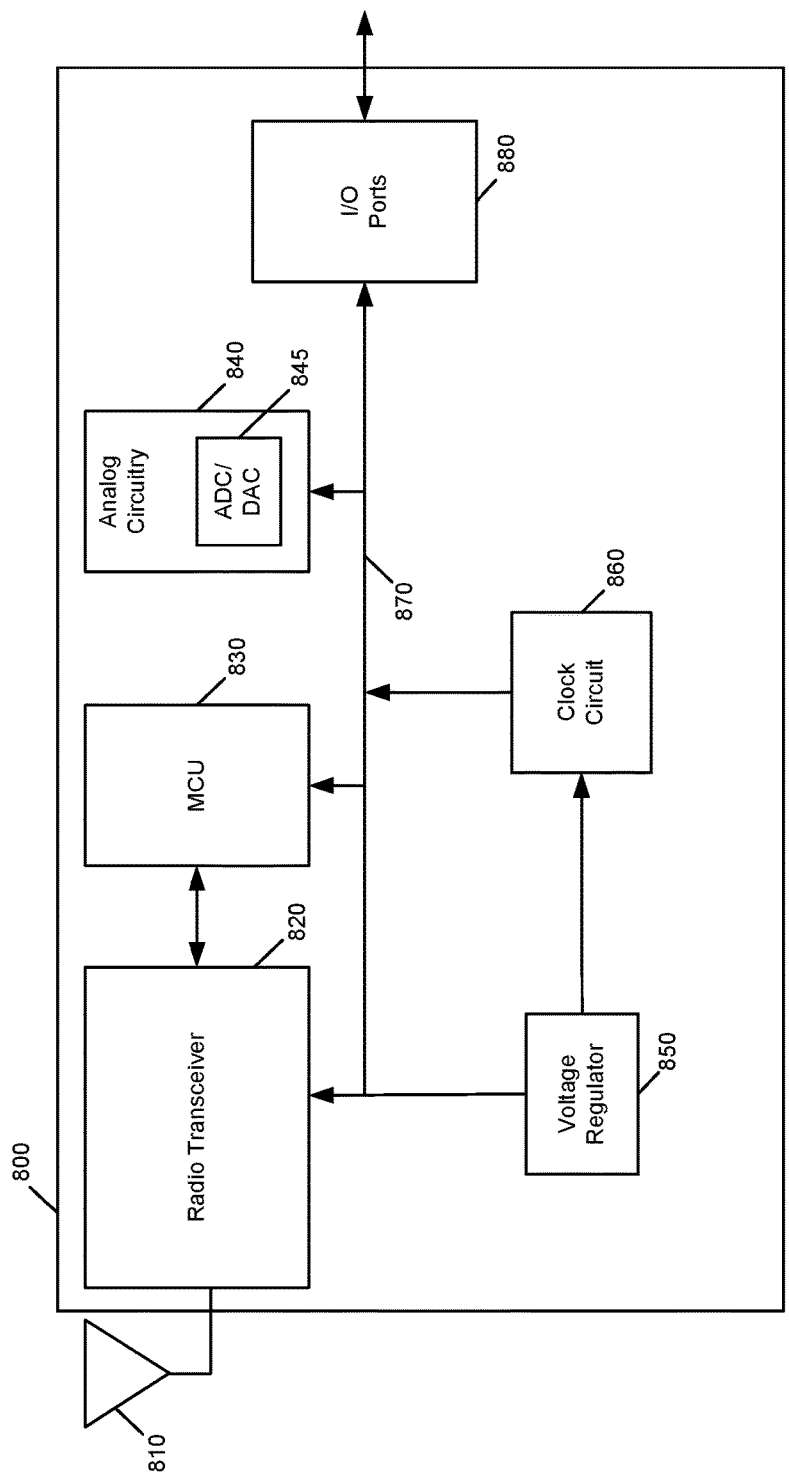
FIG. 8 is a block diagram of an integrated circuit in accordance with an embodiment.

Referring now to FIG. 8, shown is a block diagram of an integrated circuit in accordance with an embodiment. As shown in FIG. 8, integrated circuit 800 may take the form of a wireless transceiver or other such circuit. As seen, integrated circuit 800 is coupled to an antenna 810, which may provide for transmission and reception of RF signals of one or more bands (or in some cases multiple such antennas may be present).

In turn, antenna 810 couples to a radio transceiver 820 which may include one or more signal processing paths to process incoming and outgoing RF signals of the one or more bands. In various embodiments, transceiver 820 may include a controllable transformer as described herein to provide varying impedance levels to one or more power amplifiers (also included within transceiver 820), based on desired output power levels. In turn, radio transceiver 820 communicates with a microcontroller unit (MCU) 830, which may include the main processing and control circuitry of the integrated circuit. MCU 830 communicates with additional circuitry, including analog circuitry 840, which may act as an interface to various analog components such as a variety of different off-chip sensors that may couple to integrated circuit 800 via a set of I/O ports 880. In the embodiment shown, analog circuitry 840 includes an analog-to-digital/digital-to-analog circuitry (ADC/DAC) 845 to digitize incoming analog signals received from such off-chip sources and to convert to analog form digital information, such as control information to be communicated to off-chip sources. A set of interconnects 870 may couple the various components of the integrated circuit, to provide communication of power, clock and data signals.

As further illustrated in FIG. 8, integrated circuit 800 may further include a voltage regulator 850 that provides one or more regulated voltages to various units of the circuit. Furthermore, a clock circuit 860 provides a variety of different clock signals to enable operation of the different units at given operating frequencies. In embodiments herein, all components other than antenna 810 may be implemented on a single semiconductor die. Understand while shown at this high level in the illustration of FIG. 8, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first power amplifier to receive a first voltage signal and to output a first current;
a second power amplifier to receive a second voltage signal and to output a second current; and
a transformer coupled to the first power amplifier and the second power amplifier, the transformer comprising:
a primary side formed on at least one first metal layer of a semiconductor die and having a plurality of input ports including a first pair of input ports and a second pair of input ports, wherein the primary side comprises:
a first coil segment coupled between a first input port of the first pair of input ports and a first input port of the second pair of input ports;
a second coil segment coupled between a second input port of the first pair of input ports and a second input port of the second pair of input ports; and
a third coil segment coupled between the first input port of the second pair of input ports and the second input port of the second pair of input ports;
wherein the first, second, and third coil segments are formed of a plurality of conductive traces including a first set of conductive traces having a first width and a second set of conductive traces having a second width, the first and second widths providing different impedances; and
a secondary side formed on a second metal layer of the semiconductor die to form a vertical transformer, wherein the secondary side has a first output port to couple to an output load to provide an output signal and a second output port to couple to a reference voltage node.

2. The apparatus of claim 1, wherein the primary side further comprises a fourth coil segment coupled between a center tap and the second input port of the second pair of input ports, and the third coil segment is coupled between the center tap and the first input port of the second pair of input ports.

3. The apparatus of claim 2, further comprising a comparator to provide a first supply voltage to the center tap, the first supply voltage controllable based on an output power level.

4. The apparatus of claim 3, wherein the comparator is to provide the first supply voltage to the center tap when the first power amplifier is enabled and the second power amplifier is disabled.

5. The apparatus of claim 4, further comprising a control circuit to provide a second supply voltage to the center tap when the second power amplifier is enabled and the first power amplifier is disabled, the second supply voltage different than the first supply voltage.

6. The apparatus of claim 1, wherein the primary side comprises a differential primary side and the secondary side comprises a single-ended secondary side.

7. The apparatus of claim 1, wherein the first coil segment and the second coil segment comprise the first set of conductive traces having the first width and the third coil segment comprises the second set of conductive traces having the second width, wherein the first width is smaller than the second width.

8. The apparatus of claim 1, wherein the first power amplifier and the second power amplifier have different transconductances and directly couple to the transformer without a matching network.

9. The apparatus of claim 1, further comprising a controller to identify an output power level and to dynamically enable the first power amplifier and disable the second power amplifier in response to the identification of the power level.

10. The apparatus of claim 9, wherein when the second power amplifier is disabled, the first current output by the first power amplifier is to flow through the third coil segment and not the first coil segment or the second coil segment to induce the output signal in the secondary side of the transformer.

11. The apparatus of claim 10, wherein the first power amplifier is coupled to the first input port of the second pair of input ports and the second input port of the second pair of input ports, and the second power amplifier is coupled to the first input port of the first pair of input ports and the second input port of the first pair of input ports.

12. The apparatus of claim 1, wherein the first power amplifier comprises a complementary amplifier having a first plurality of N-channel metal oxide semiconductor field effect transistors (MOSFETs) and a first plurality of P-channel MOSFETs and the second power amplifier comprises an open-drain amplifier having a second plurality of N-channel MOSFETs.

13. An integrated circuit comprising:
a power amplifier to receive a first voltage signal and to output a first current;
a transformer coupled to the power amplifier, the transformer comprising:
a primary side formed on at least one first metal layer of a semiconductor die and having a pair of input ports, wherein the primary side comprises:
a first coil segment coupled between a first input port of the pair of input ports and a first node;
a second coil segment coupled between a second input port of the pair of input ports and a second node; and
a third coil segment coupled between the first node and the second node; and
a secondary side formed on a second metal layer of the semiconductor die to form a vertical transformer, wherein the secondary side has a first output port to couple to an output load and a second output port to couple to a reference voltage node; and
a switch coupled between the first node and the second node to switchably couple the third coil segment to the transformer when open and decouple the third coil segment from the transformer when closed.

14. The integrated circuit of claim 13, wherein the primary side further comprises a fourth coil segment coupled between a center tap and the second node, wherein the third coil segment is coupled between the center tap and the first node.

15. The integrated circuit of claim 14, wherein the primary side is formed of a plurality of conductors including a first set of conductors having a first width and a second set of conductors having a second width, and wherein the first coil segment and the second coil segment comprise the first set of conductors and the third coil segment and the fourth coil segment comprise the second set of conductors, the first width larger than the second width.

16. The integrated circuit of claim 13, wherein the switch when enabled is to short the first node and the second node and to decouple the third coil segment.

17. The integrated circuit of claim 13, wherein the power amplifier comprises:
a first transistor to receive a first portion of the first voltage signal;
a first cascode transistor to receive an output of the first transistor and to output a first portion of the first current to the transformer; and
a first current mirror to provide a first mirror current to the first transistor.

18. An apparatus comprising:
a transceiver to communicate signals according to one or more wireless communication protocols, the transceiver comprising:
a first power amplifier to receive a first voltage signal and output a first current;
a second power amplifier to receive a second voltage signal and output a second current;
a multi-port transformer coupled to the first power amplifier and the second power amplifier, the multi-port transformer comprising:
a primary side formed on at least one first metal layer of a semiconductor die and having a first pair of input ports and a second pair of input ports, wherein:
the first power amplifier is coupled to a first input port of the first pair of input ports and a second input port of the first pair of input ports; and
the second power amplifier is coupled to a first input port of the second pair of input ports and a second input port of the second pair of input ports;
wherein a first set of conductive traces couple between the first input port of the second pair of input ports and the second input port of the second pair of input ports; and
wherein a second set of conductive traces couple between the first input port of the first pair of input ports and the second input port of the first pair of input ports, the first set of conductive traces and the second set of conductive traces having different widths to provide different impedances; and
a secondary side formed on a second metal layer of the semiconductor die to form a vertical transformer, wherein the secondary side is to couple to an antenna; and
the antenna coupled to the transceiver to send the signals wirelessly.

19. The apparatus of claim 18, further comprising:
a unity gain buffer to provide a first supply voltage to a center tap of the primary side when the first power amplifier is enabled and the second power amplifier is disabled, the first supply voltage controllable based on an output power level, the center tap coupled between the first input port of the second pair of input ports and the second input port of the second pair of input ports; and
a control circuit to provide a second supply voltage to the center tap when the second power amplifier is enabled and the first power amplifier is disabled, the second supply voltage different than the first supply voltage.

20. The apparatus of claim 18, wherein the first set of conductive traces have the first width, wherein the second set of conductive traces have the second width, and wherein the first width is smaller than the second width.

* * * * *